(12) United States Patent
Milsom

(10) Patent No.: US 6,448,695 B2
(45) Date of Patent: Sep. 10, 2002

(54) BULK ACOUSTIC WAVE DEVICE

(75) Inventor: Robert F. Milsom, Redhill (GB)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/884,218

(22) Filed: Jun. 19, 2001

(30) Foreign Application Priority Data

Jun. 20, 2000 (GB) .............................................. 0014963

(51) Int. Cl.$^7$ .............................................. H01L 41/08
(52) U.S. Cl. ..................... 310/334; 310/366; 333/191
(58) Field of Search ................... 310/334, 366; 333/186–191

(56) References Cited

U.S. PATENT DOCUMENTS

| | | | | |
|---|---|---|---|---|
| 3,656,180 A | * | 4/1972 | Braun ..................... | 310/366 X |
| 3,942,139 A | * | 3/1976 | Cooper et al. .......... | 310/334 X |
| 4,320,365 A | * | 3/1982 | Black et al. ............. | 333/187 |
| 4,329,666 A | * | 5/1982 | Arvanitis .................. | 333/191 |
| 4,427,913 A | * | 1/1984 | Iafrate et al. ............ | 310/334 |
| 4,692,653 A | * | 9/1987 | Kushida et al. ......... | 310/334 |
| 5,872,493 A | * | 2/1999 | Ella .......................... | 333/191 |
| 5,873,154 A | * | 2/1999 | Ylilammi et al. ....... | 310/334 X |

FOREIGN PATENT DOCUMENTS

WO 9816957 A1 4/1998

* cited by examiner

Primary Examiner—Mark O. Budd
(74) Attorney, Agent, or Firm—Steven R. Biren

(57) ABSTRACT

A bulk acoustic wave device has a number of resonator elements (14) which are laterally spaced such that a signal (26) applied between to one resonator element ($14_1$) at a resonant frequency of the device is coupled to the other resonator elements ($14_2$, $14_3$, $14_4$) by acoustic coupling between piezoelectric layers of the resonator elements (14). There are two outer resonator elements ($14_1$, $14_5$) and at least one inner resonator element ($14_2$, $14_3$, $14_4$). The terminals of the inner resonator elements are electrically connected together. This connection provides an AC short which eliminates the effect of the parasitic capacitances of the inner resonator elements, and provides electromagnetic shielding between the input and output of the device, by reducing the parasitic capacitance between the input and output upper electrodes.

13 Claims, 4 Drawing Sheets

BULK ACOUSTIC WAVE DEVICE

FIELD OF THE INVENTION

The present invention relates to a bulk acoustic wave (BAW) device and its manufacture and particularly a filter comprising solidly mounted BAW resonators. The invention also relates to communications equipment (for example a radio frequency receiver and/or transmitter) comprising such filters.

BACKGROUND OF THE INVENTION

Mobile communications products, such as cellular phone handsets, are required to be small and light. It is predicted that in the future even smaller communication devices will be available integrated into, for example, wrist-watches and clothing. All such products require radio-frequency (RF) filters approximately covering the range 0.5 GHz to 10 GHz to protect the received signal from interference, either from the transmitter in the same handset and/or from unwanted externally generated signals. These filters must have low pass-band insertion loss (typically<2 Db) in order to achieve adequate signal-to-noise ratio. To achieve this, the resonators, which are the basic building blocks of filters, must have high quality factor Q. This is defined as the energy stored per cycle in a resonator at the resonant frequency divided by the energy lost per cycle by the resonator at the same frequency. Typically, values for Q in excess of 500 are desirable and achievable.

Resonators normally employ some form of standing wave in a cavity. Both discrete and distributed reflections may be used. Conventional bulk acoustic wave and surface acoustic wave (SAW) resonators are examples of resonators relying on these two options. To keep size to a minimum, discrete reflections are preferred because the length of the cavity is then typically only ½ a wavelength of the mode employed at the resonant frequency. Thus BAW resonators are potentially much smaller than SAW resonators for which a cavity length of the order of 100 wavelengths may be required, and are preferred for this reason.

Resonators are available that rely on acoustic waves or electromagnetic waves. Acoustic wave resonators are preferred to those employing electromagnetic waves for two principal reasons. Firstly, the velocity of acoustic waves propagating in a material is typically 4 to 5 orders of magnitude lower than the velocity of electromagnetic waves, so that a substantial size reduction is possible for any given frequency. Secondly, achievable mechanical quality factors are typically larger than achievable electrical quality factors for the same materials.

Two general types of BAW resonators have been studied for RF applications. In the first of these a thin membrane forms the resonating cavity. This approach is unattractive because the membranes are fragile and subject to buckling caused by stress. In the second, so-called SMRs (solidly-mounted resonators) are used as shown in FIG. 1. In devices such as these, one or more acoustically mismatched layers 2 are mounted on a substrate 4 and act to reflect the acoustic wave. Upper 6 and lower 8 electrodes are formed on the substrate 4 separated by a piezoelectric layer 10. Since the reflector layer(s) are deposited on a solid substrate, the structure of a SMR is robust.

In the BAW resonator shown in FIG. 1, the required conversion between electrical and mechanical energy is achieved by the layer 10 of piezoelectric material arranged between two metal layers in which electrodes $6_1$, $6_2$ and 8 are formed. Although the SMR employs a more distributed reflection than the thin membrane resonator, resonator size is not significantly increased because thickness is predominantly determined by the substrate in both cases. Each upper electrode $6_1$ and $6_2$ defines an individual resonator with the underlying piezoelectric layer and lower electrode. These two resonators are effectively electrically connected in series, with the common lower electrode 8 at the junction between them. A resonator is a one-port device. In the construction shown in FIG. 1, its two terminals are formed by electrodes $6_1$ and $6_2$.

RF filters reported to date have been constructed by electrically connecting SMRs in either a ladder or lattice configuration. Ladder configurations of the filters have demonstrated good performance with passband insertion loss at less than 2 dB and very low levels of spurious response. However, there are a number of disadvantages with such arrangements. For example, at frequencies removed from the acoustic resonances, each resonator appears as a capacitor, so the overall filter stop-band response is essentially that of a capacitor network. This leads to a requirement for additional resonators just to reduce the stop-band. Consequently, both the area occupied and the insertion loss in the pass-band are increased without improving selectivity. A large number of resonators is required for even a moderate stop-band level (e.g. a minimum of 9 resonators for approximately 45 dB stop-band). With the drive towards the miniaturization of filters in RF applications this is a serious problem.

In addition, series and shunt resonators in the ladder configuration are required to be centred on different frequencies due to the arrangement of the individual resonators. This means, for example, that an additional mass-loading layer, of very precise thickness, must be deposited on the shunt resonators to reduce their anti-resonance (minimum-admittance) frequency to the same as the resonance (minimum-impedance) frequency of the series resonators.

FIG. 2 shows a schematic representation of an electrical equivalent circuit model for a conventional BAW resonator such as that shown in FIG. 1. $C_0$ is the static capacitance of the resonator, $C_m$ and $L_m$ are respectively the motional capacitance and inductance, and $R_m$ is the motional resistance which characterises the mechanical losses of the resonator. The resonant frequency is given by $f_0 = 1/[2\pi\sqrt{(C_m L_m)}]$, and the unloaded quality factor is given by $Q_u = (2\pi f_0 L_m)/R_m$.

The manufacturing process for a thin film bulk acoustic wave resonator will be known by those skilled in the art. For example, International Patent Application number WO98/16957 discloses a thin film bulk acoustic wave resonator and a method of manufacturing the same, the contents of which are incorporated herein by reference.

As explained above, in a filter it is usual to arrange more than one resonator in a lattice or ladder configuration connected electrically to each other to obtain optimum filter characteristics. Connecting a number of filters like the one shown in FIG. 1 causes an inherent lack of design flexibility due to the presence of the static capacitance $C_0$ in each resonator. As a consequence, approximations to standard ideal filter types such as Butterworth or Chebyshev are not readily implemented. The electrical connection of the resonators in a ladder configuration also produces the need for the series and shunt resonators to be centred on different frequencies.

SUMMARY OF THE INVENTION

According to the present invention, there is provided a bulk acoustic wave device comprising:

one or more acoustic reflector layers formed on a substrate;

a lower electrode formed on said acoustic reflector layer or layers;

a piezoelectric layer formed on said lower electrode; and, at least three upper electrodes formed over said piezoelectric layer each upper electrode at least partially overlying the lower electrode and defining with an underlying piezoelectric layer portion and the lower electrode a resonator element, in which said upper electrodes are laterally spaced such that a signal applied between one of said upper electrodes and said lower electrode at a resonant frequency of the device is coupled to the other resonator elements by acoustic coupling between the piezoelectric layer portions and in which the upper electrodes are arranged so that there are two outer and at least one inner upper electrodes and in which the or each inner upper electrode is electrically connected to the lower electrode.

The invention provides a device employing SMRs, which are acoustically rather than electrically coupled. This acoustic coupling enables the device to be smaller and leads to more flexible filter design. The electrical connection between electrodes is such as to provide a fixed potential between the inner upper electrode(s) and the lower electrode. This potential is preferably zero, and they are preferably earthed. This earthing provides electromagnetic shielding between the input and output of the device, by reducing the parasitic capacitance between the input and output upper electrodes.

The connection between the inner upper electrode and the lower electrode is typically by means of one or more vias.

Preferably, each resonator is centred on the same resonant frequency. This enables a simpler layer structure and is possible because all the resonators form shunt arms, the equivalent of series arms being implicitly provided by the acoustic coupling between adjacent resonators. Thus, it is possible to increase the number of resonators in the device to achieve a higher-order filter, rather than just to decrease the stop-band level as in existing designs. It is thus possible to implement a filter design without resorting to the conventional ladder configuration in which shunt resonators have an anti-resonance frequency set at the same frequency as the resonance frequency of series resonators. The invention improves the simplicity of manufacture and therefore reduces the costs of manufacturing the device.

Preferably, the separation between the laterally spaced upper electrodes is between 0.5 and 2.0 $\mu$m and more preferably between 0.7 and 1.3 $\mu$m. Having a separation of the order of 1 $\mu$m ensures that the acoustic coupling between adjacent upper electrodes and the associated resonators is achieved.

Preferably, the piezoelectric layer is selected to have a thickness substantially equal to ½ a wavelength of the dominant acoustic mode at the resonant frequency.

According to a second aspect of the present invention, there is provided a method of designing a bulk acoustic wave device having two outer resonators and at least one inner resonator each of the resonators being laterally spaced with respect to the adjacent resonator or resonators and each resonator having an upper electrode, a lower electrode and an interposed piezoelectric layer, the method comprising the steps of:

determining an optimum upper electrode width for energy-trapping a single mode of oscillation within the locality of the electrode;

determining normalized low-pass prototype values for a selected filter type and from these determining the loaded quality factors of the outer resonators;

determining required areas for the outer upper electrodes of the filter in dependence on loaded quality factors of the outer resonators;

in dependence on these areas, and the optimum electrode width for energy-trapping a single mode, calculating the lengths of each of the outer electrodes;

from the normalized low-pass prototype values determining the interresonator coupling coefficients, and then determining the widths of the gaps between the resonators, in dependence on a previously-determined relationship between coupling coefficient and interresonator spacing.

BRIEF DESCRIPTION OF THE DRAWING

Examples of the present invention will now be described in detail with reference to the accompanying drawings, in which.

DESCRIPTION OF THE PREFERRED EMBODIMENTS

Figure 1A:
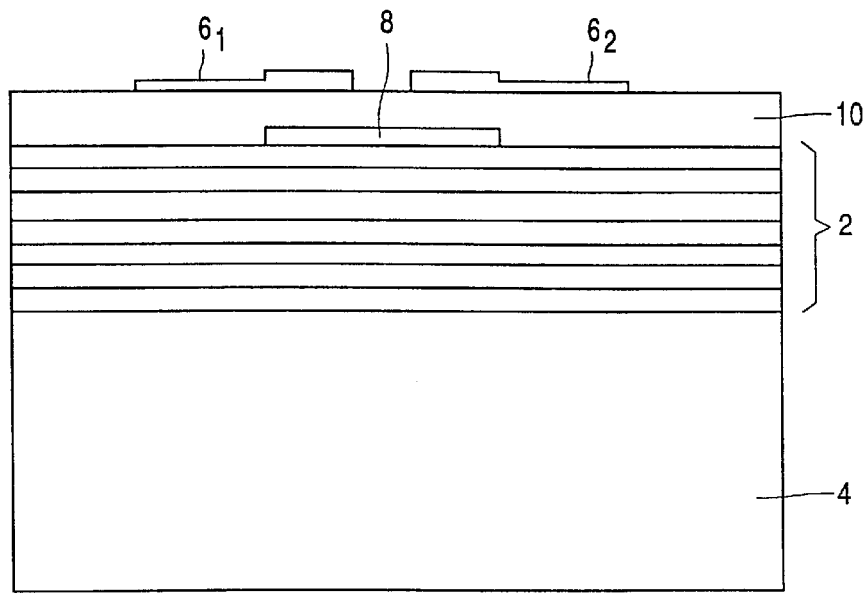
FIGS. 1a and 1b show a section and a plan view respectively of a conventional solidly mounted BAW resonator formed as two series connected resonators.
Figure 3:
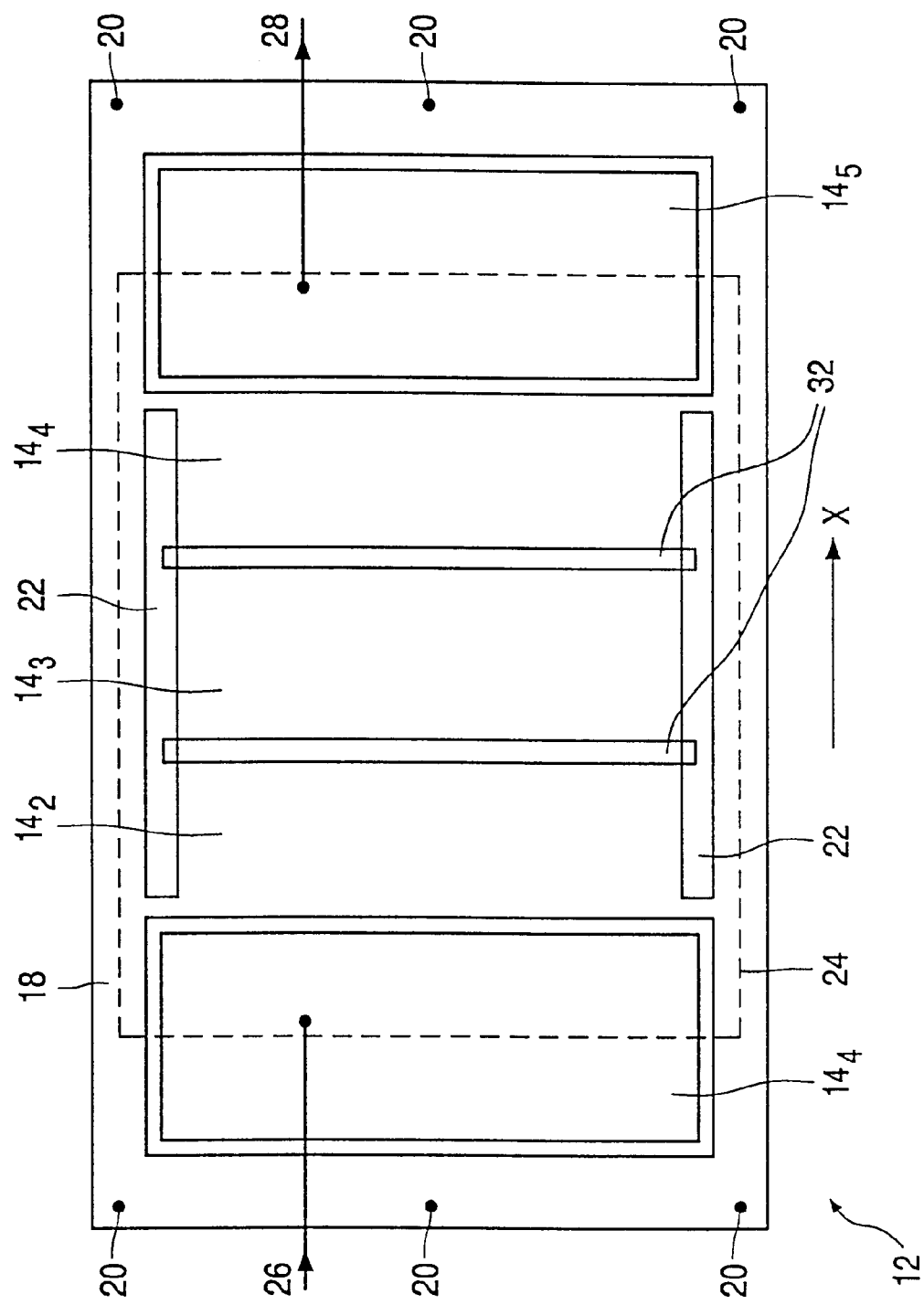
FIGS. 3 and 4 show respectively a plan view and section of an example of a filter according to the present invention.
Figure 4:
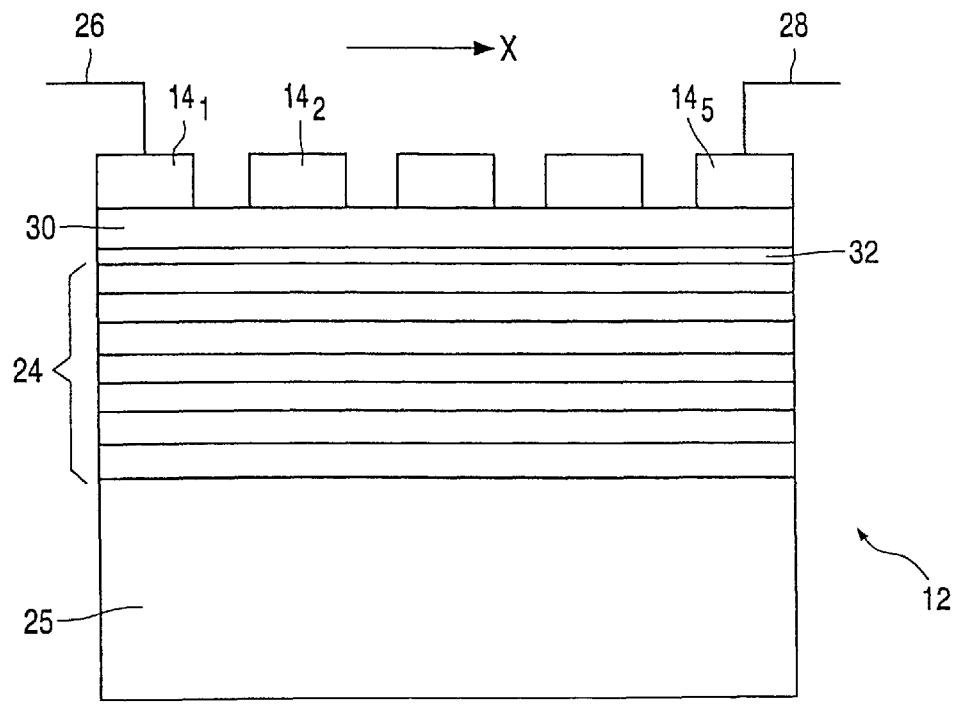

FIGS. 3 and 4 show a possible configuration for a fifth-order filter according to the present invention in plan and section respectively. The thin-film layer structure is essentially that shown in FIG. 1a and is described below with reference to FIG. 4. The configuration is suitable for common-mode connection.

Figure 1B:
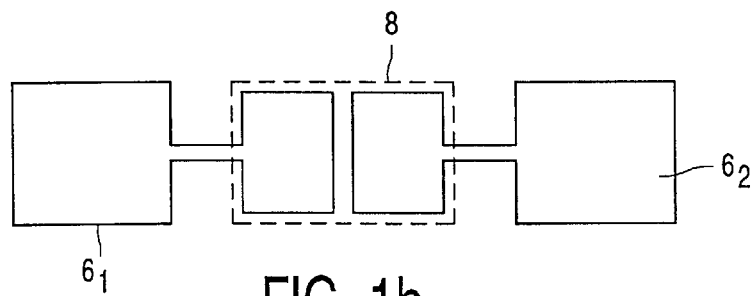

Referring to FIGS. 3 and 4, the filter 12 has a set of upper electrodes $14_1$ to $14_5$ formed from an upper layer of metal 18. Upper electrodes $14_1$ and $14_5$ function as the input and output electrodes of the device and are electrically isolated from electrodes $14_2$ to $14_4$. A number of earthing contacts 20 are provided connecting electrodes $14_2$ to $14_4$ to ground. The contacts 20 indicate possible locations for either flip-chip or wire-bond connections. A lower layer of metal 32 is provided and in this example this is earthed by a connection to electrodes $14_2$ to $14_4$ by two vias 22. A piezoelectric layer 30 is provided separating the upper and lower layers of metal and serves to convert an electrical signal applied to the device between upper electrodes $14_1$ and $14_2$ to an acoustic vibration. The layout in FIG. 3 has the same number of resonators as the order of the filter, in this case five. As in FIG. 1, one or more acoustically mis-matched layers 24 are mounted on a substrate 25 and act to reflect the acoustic wave generated by the piezoelectric layer 30.

In use, an electrical signal is received by input 26 which is connected to electrode $14_1$ thereby generating acoustic waves in the piezoelectric layer 30. As will be explained below, the acoustic waves are reflected by the acoustically mismatched layers 24 and a wave at the resonant frequency of the device is acoustically coupled to electrode 14$_2$. This process is repeated between consecutive pairs of the electrodes until the signal is output from electrode 14$_5$ via output 28.

The acoustic modes supported by layered structures differ significantly from those present in single crystals. The resonators and filter shown in FIGS. 3 and 4 employ specific modes of oscillation, namely thickness modes whose resonant frequency is largely determined by the thickness of a resonator (i.e. the combined thickness of the piezoelectric and electrode layers) rather than its other dimensions. The filter employs acoustically-coupled resonators relying on the concept of "energy-trapping". This is the confinement of an acoustic vibration to an electroded region of a resonator and it occurs because of the different wave-guiding properties and cut-off frequencies of the electroded and unelectroded regions of the resonator. The relevant guided wave is required to be a cut-off mode of the unelectroded region, so the stored energy decays rapidly with distance from the electrode edge. The width of the electrode determines how many modes are energy-trapped, while the spatial rate of decay of the evanescent energy and the width of the gap between adjacent resonators determines the degree of coupling between them. A separation between the edges of adjacent resonators in the region of 0.5 to 2.0 $\mu$m, preferably 0.7 to 1.3 $\mu$m, provides a satisfactory amount of acoustic coupling.

A SMR generally relies upon the lowest thickness extensional mode known as TE1, for which the particle motion is normal to the surface (at least in a 1D approximation). Excitation of this particular mode is a consequence of the orientation of the deposited thin films of piezoelectric material. Recommended materials for use as the piezoelectric layer are any materials which naturally form c-axis normal layers such as ZnO, AIN, PZT and PLZT.

In the 1D SMR model, the resonant mode appears as a pure thickness extensional (TE) mode at all frequencies, so coupling to other modes is not taken into account. For the proposed structure it is necessary to consider field variations and components of particle motion in directions parallel to, as well as normal to, the layer surfaces. The field equations must be solved to obtain the wavenumbers as functions of frequency (i.e. the dispersion relationships) for each mode and each region. These solutions show which layer configurations and thicknesses can support the required oscillations, and which are likely to support energy-trapped modes. The relationships between electrodes and gap widths and inter-resonator coupling also follows from the dispersion relationships.

The acoustic coupling in the device of the invention typically results from both thickness extensional (TE) and thickness shear (TS) modes. However, other modes may be excited at a level that gives rise to unacceptable spurious responses unless the proposed structure is optimally designed.

Figure 2:
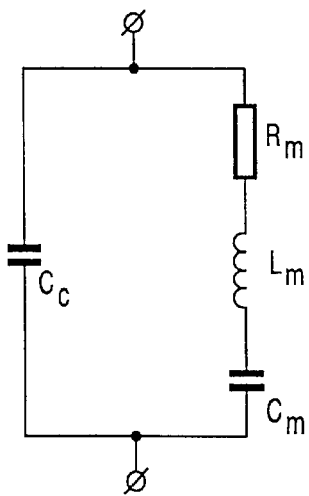
FIG. 2 shows an electrical equivalent circuit for a conventional BAW resonator.
Figure 5:
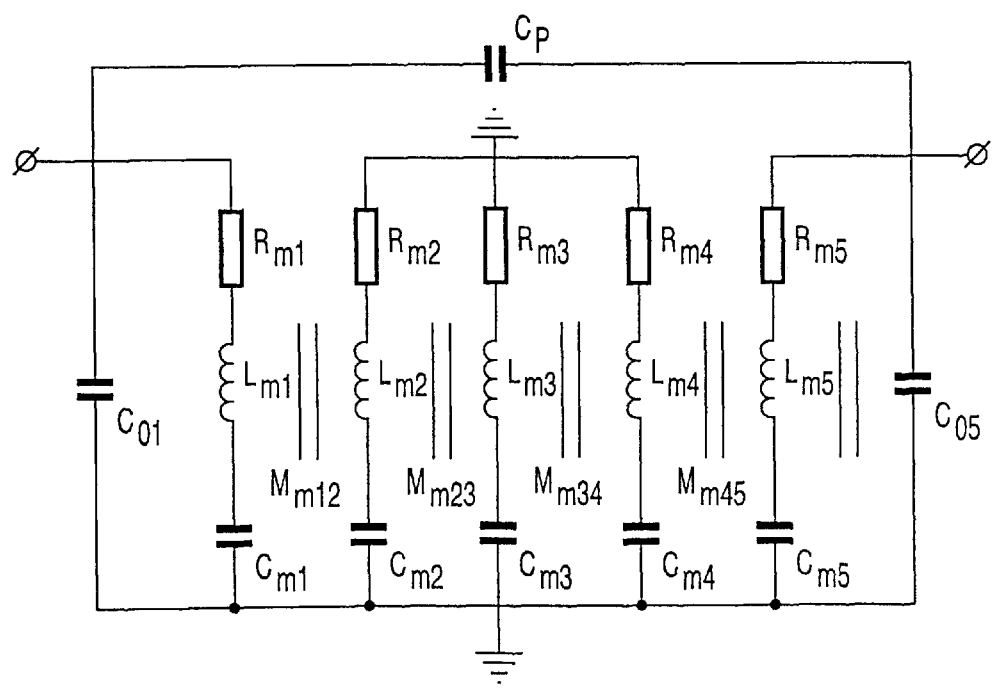
FIG. 5 shows an electrical equivalent circuit for the filter of FIGS. 3 and 4.

FIG. 5 shows an electrical equivalent circuit for the resonator of FIG. 3. The circuit includes a number of circuits like that shown in FIG. 2, coupled in parallel. The acoustic coupling between resonators means that the inner resonators (i.e. all apart from the input and output resonator) do not transmit the signal by means of their electrical terminals. This enables those terminals to be connected electrically, for example both connected to earth, which eliminates the effect of the static capacitances of those resonators.

As shown in FIG. 5, the acoustic coupling may be characterised by mutual inductances M between the adjacent resonators in the equivalent electrical circuit model. Mutual inductors $M_{jj+1}$ are included between motional inductances $L_{mj}$ and $L_{mj+1}$ of each pair of adjacent resonators. The static capacitance is excluded from each of the internal resonators since, in this particular design, both of the electrodes of these resonators are grounded, thus shorting out $C_0$ and hence increasing filter design flexibility. $C_p$ is the parasitic capacitance between the input and output upper electrodes which may be determined using electrostatic analysis. Approximate values for $C_0$ (for each end resonator) and $C_m$, $L_m$ and $R_m$ (for all resonators) may be obtained from a 1D acoustic field model of the resonator.

Determination of the $M_{jj+1}$ requires (at least) a 2D acoustic field model, the extra dimension included being the direction parallel to the short sides (in the direction X) of the resonators in FIGS. 3 and 4. Approximate values for these components are given by matching the resonant frequencies predicted by the circuit model and the 2D field model for two closely-spaced resonators. Each gap width and mutual inductance value also corresponds to a coupling coefficient required in the filter design procedure described below. Higher values of mutual inductance and coupling coefficient correspond to closer inter-resonator spacing.

The design of a BAW device according to the invention will now be described in greater detail. It is assumed that a layer structure, suitable for stand-alone resonators at the desired centre frequency $f_0$ of the filter, has been determined, and that the 1D model has been used to determine normalized single-resonator equivalent-circuit component values (i.e. values for unit area). A possible filter design procedure for the layout in FIGS. 3 and 4 is then as follows:

Use the 2D model to determine the optimum resonator width for energy-trapping a single mode. Then, from the filter specification a filter type is chosen such as Butterworth or any other desired type with appropriate 3 dB bandwidth, filter order and pass-band ripple.

The corresponding so-called "normalized low-pass prototype" values are then computed or obtained from published look-up tables. From these values the loaded quality factors $Q_L$ of the input and output resonators i.e. the resonators at the input and output of the filter, and the de-normalized single-resonator equivalent-circuit component values are computed. The denormalised static capacitances are used to determine required areas for these two resonators.

From these areas, and the previously-computed optimum width for energy-trapping a single mode, the lengths of each of the input and output resonators is calculated. Initially the widths and lengths of the internal resonators can be set to the same values. From the normalized low-pass prototype values it is then necessary to compute and de-normalize the inter-resonator coupling coefficients which are used to quantify the efficiency of the coupling between adjacent resonators, and then use the previously-determined relationship between coupling coefficient and inter-resonator spacing to determine the first estimate of the widths of the gaps between resonators, and also the mutual inductances for the equivalent circuit model.

Finally the full 2D acoustic field model can be used to optimise the resonator and gap widths such than the response is as close as possible to that specified, and to ensure that responses due to coupling to unwanted modes are adequately suppressed.

A number of advantages are obtained by adopting the filter structure described with reference to FIGS. 3 and 4. Firstly, for any configuration of filter the ultimate stop-band level is degraded by electromagnetic (mainly capacitive) coupling between input and output. By using vias and other connections to short all electrodes except the input and output to ground, as in FIG. 3, maximum shielding is obtained. Secondly, as described above, the unwanted parasitic static capacitances of the internal resonators, that limit filter design flexibility, are effectively removed without modifying the useful motional components. Finally, it should be noted that the fabrication of filters according to the present invention, employing acoustically-coupled resonators, is simpler than for the electrically-coupled type since all resonators can be centred on the same frequency and therefore use the same layer structure.

Figure 6:
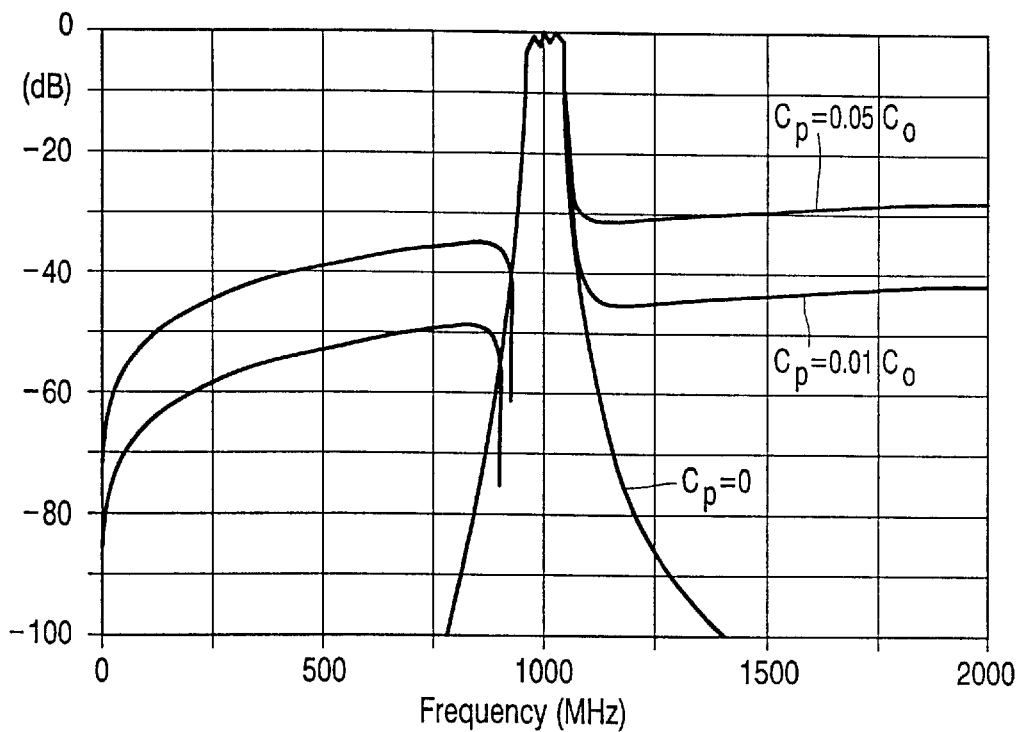
FIG. 6 shows the response characteristic of a fifth order filter according to the present invention predicted by the equivalent circuit in FIG. 5 for three different values of parasitic capacitance between input and output of the device; and, FIG. 7 shows the variation of pass band response of the filter of FIG. 6 for three different values of Q.
Figure 7:
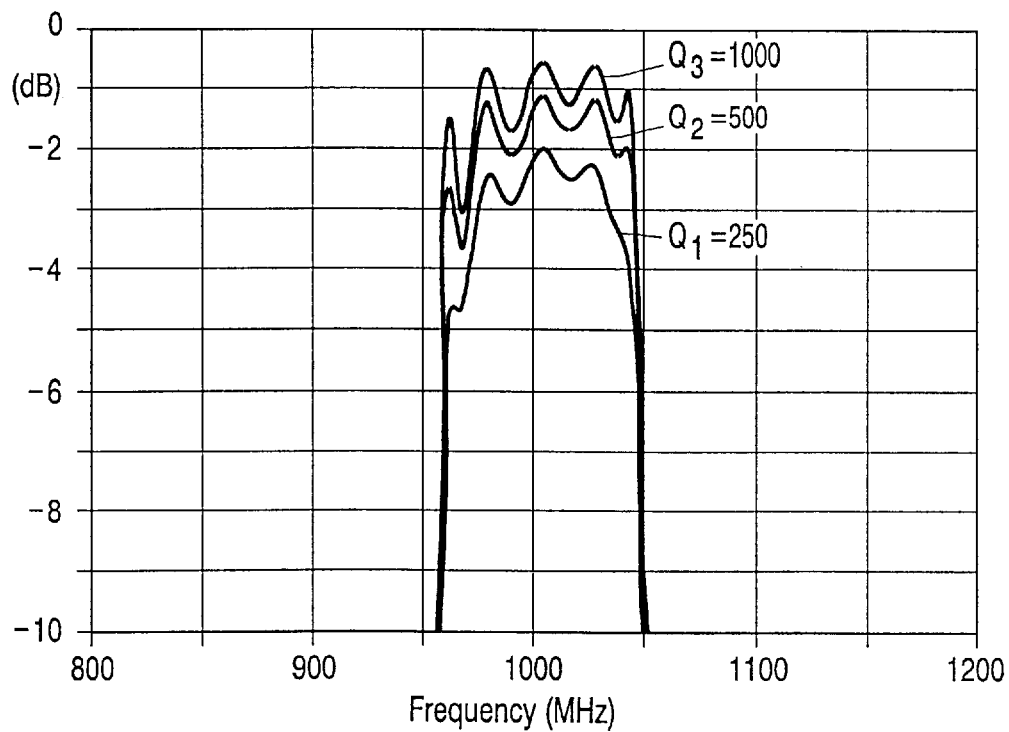

The response, predicted using the equivalent circuit in FIG. 5, of a fifth-order Chebyshev filter (employing PZT-4 in the piezoelectric layer) is shown in FIGS. 6 and 7. The potential degradation of the stop-band due to parasitic capacitance between input and output, which is minimised in the layout in FIG. 3, is shown in FIG. 6. A resonator Q of 1000 was assumed.

The graph shows the response of the filter assuming different values of parasitic coupling capacitor $C_p$ between input and output electrodes: $C_p$=0 (bottom curve), $C_p$=0.01 $C_0$ (middle curve), $C_p$=0.05 $C_0$ (top curve) FIG. 7 shows the effect on the pass-band of the device for different values of quality factor Q. This suggests that 2 dB insertion loss is possible with a Q of 500, a value which is within the capabilities of the technology. The area of the filter would be about 50 $\mu$m square, excluding pads for connections. This is much smaller than filters with comparable performance using any known technology and design approach. A filter of such dimensions could be integrated with other components on silicon (for example), or flip-chip mounted on the substrate of a small MCM (multi-chip module). The size is sufficiently small to consider designing, for example, a bank of RF filters to provide the front-end selectivity in a multi-mode multi-band UMTS/GSM handset.

FIG. 3 shows one specific possible configuration for resonators in the device of the present invention, although alternatives are also possible. For example, it would be possible to have a first and second row of resonators arranged in parallel between differential mode terminations, with each pair of corresponding resonators in the two rows connected in series. Various other modifications will be apparent to those skilled in the art.

What is claimed is:

1. A bulk acoustic wave device, comprising:
   one or more acoustic reflector layers formed on a substrate;
   a substantially continuous lower electrode formed on said acoustic reflector layer or layers;
   a piezoelectric layer formed on said lower electrode; and,
   at least three substantially coplanar upper electrodes formed over said piezoelectric layer each upper electrode at least partially overlying the lower electrode and defining with an underlying piezoelectric layer portion and the lower electrode a resonator element, in which said upper electrodes are laterally spaced such that a signal applied between one of said upper electrodes and said lower electrode at a resonant frequency of the device is coupled to the other resonator elements by acoustic coupling between the piezoelectric layer portions and in which the upper electrodes are arranged so that there are two outer and at least one inner upper electrodes and in which the or each inner upper electrode is electrically connected to the lower electrode.

2. A device according to claim 1, in which each resonator is centred on the same resonant frequency.

3. A device according to claim 1, in which the or each inner upper electrode ($14_2$, $14_3$, $14_4$) and the lower electrode (32) are connected to a common potential.

4. A device according to claim 3, in which the common potential is earth potential.

5. A device according to claim 1, in which a separation between the laterally spaced upper electrodes (14) is between 0.5 and 2.0 $\mu$m.

6. A device according to claim 1, in which the piezoelectric layer (30) is selected to have a thickness equal to one half wavelength of an acoustic wave at the resonant frequency of the device.

7. A device according to claim 1, in which the piezoelectric layer (30) is made of a material selected from the group consisting of ZnO, AlN, PZT and PLZT.

8. A device according to claim 1, having an area between 100 and 10,000 $\mu$m$^2$.

9. A device according to claim 1, in which the one or more acoustic reflector layers (24) is or are made of porous silicon oxide.

10. A radio frequency band pass filter comprising a device as claimed in claim 1.

11. A radio frequency receiver and/or transmitter comprising a band pass filter as claimed in claim 10.

12. A method of designing a bulk acoustic wave device having two outer resonators and at least one inner resonator each of the resonators being laterally spaced with respect to the adjacent resonator or resonators and each resonator having an upper electrode, a lower electrode and an interposed piezoelectric layer, the method comprising the steps of:
   determining an optimum upper electrode width for energy-trapping a single mode of oscillation within the locality of the electrode;
   determining normalized low-pass prototype values for a selected filter type and from these determining the loaded quality factors of the outer resonators;
   determining required areas for the outer upper electrodes of the filter in dependence on loaded quality factors of the outer resonators;
   in dependence on these areas, and the optimum electrode width for energy-trapping a single mode, calculating the lengths of each of the outer electrodes;
   from the normalized low-pass prototype values determining the inter-resonator coupling coefficients, and then determining the widths of the gaps between the resonators, in dependence on a previously-determined relationship between coupling coefficient and inter-resonator spacing.

13. A method according to claim 12, further comprising the step of:
   using a full 2D field model for the filter to adjust the resonator and gap widths such that the response of the filter is optimised.

* * * * *